US 12,534,800 B2

United States Patent
Ifuku et al.

(10) Patent No.: US 12,534,800 B2
(45) Date of Patent: Jan. 27, 2026

(54) PRE-COATING METHOD AND PROCESSING APPARATUS (71) Applicant: Tokyo Electron Limited, Tokyo (JP)

(72) Inventors: Ryota Ifuku, Nirasaki (JP); Takashi Matsumoto, Nirasaki (JP); Masahito Sugiura, Nirasaki (JP); Makoto Wada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 242 days.

(21) Appl. No.: 17/997,410

(22) PCT Filed: Apr. 16, 2021

(86) PCT No.: PCT/JP2021/015663
§ 371 (c)(1),
(2) Date: Oct. 28, 2022

(87) PCT Pub. No.: WO2021/220841
PCT Pub. Date: Nov. 4, 2021

(65) Prior Publication Data
US 2023/0167547 A1    Jun. 1, 2023

(30) Foreign Application Priority Data
May 1, 2020   (JP) .................. 2020-081415

(51) Int. Cl.
*C23C 16/26*   (2006.01)
*C23C 16/44*   (2006.01)
(Continued)

(52) U.S. Cl.
CPC .......... *C23C 16/4404* (2013.01); *C23C 16/26* (2013.01); *C23C 16/50* (2013.01);
(Continued)

(58) Field of Classification Search
CPC ..... C23C 16/4404; C23C 16/26; C23C 16/50; C23C 16/4405; C23C 16/45557;
(Continued)

(56) References Cited

U.S. PATENT DOCUMENTS

| 6,066,399 A | * | 5/2000 | Hirano | .................. C23C 16/029 |
| | | | | 427/249.1 |
| 2007/0295272 A1 | * | 12/2007 | Padhi | ................. C23C 16/4404 |
| | | | | 427/248.1 |

(Continued)

FOREIGN PATENT DOCUMENTS

| JP | H04-345030 A | 12/1992 |
| JP | 2005-150622 A | 6/2005 |

(Continued)

OTHER PUBLICATIONS

EP 09338906 machine translation (Year: 1999).*
WO 2013/069593 machine translation (Year: 2013).*

*Primary Examiner* — Gordon Baldwin
*Assistant Examiner* — Christina D Mcclure
(74) *Attorney, Agent, or Firm* — Armstrong Teasdale LLP (57) ABSTRACT

A method of pre-coating a carbon film by plasma in a processing container, includes: pre-coating an inner wall of the processing container with a first carbon film by plasma of a first carbon-containing gas under a first pressure; and processing the first carbon film with the plasma under a second pressure.

5 Claims, 8 Drawing Sheets (51) Int. Cl.
*C23C 16/50* (2006.01)
*H01J 37/32* (2006.01)

(52) U.S. Cl.
CPC .. *H01J 37/32449* (2013.01); *H01J 37/32495* (2013.01); *H01J 2237/3323* (2013.01)

(58) Field of Classification Search
CPC ... C23C 16/4586; C23C 16/511; C23C 16/52; C23C 16/56; H01J 37/32449; H01J 37/32495; H01J 2237/3323; H01L 21/3065; H01L 21/31
See application file for complete search history.

(56) References Cited

U.S. PATENT DOCUMENTS

| | | | |
|---|---|---|---|
| 2012/0015521 A1* | 1/2012 | Yu | H01L 21/0332 |
| | | | 257/E21.258 |
| 2018/0230597 A1* | 8/2018 | Ma | H01J 37/32 |
| 2018/0233331 A1* | 8/2018 | Hosoya | C23C 16/45523 |
| 2018/0308684 A1* | 10/2018 | Thomas | H01L 21/02532 |

FOREIGN PATENT DOCUMENTS

| | | | | |
|---|---|---|---|---|
| JP | 2019-009403 A | | 1/2019 | |
| KR | 10-2014-0093939 A | | 7/2014 | |
| WO | WO-2019199681 A1 * | | 10/2019 | C23C 16/26 |

\* cited by examiner

PRE-COATING METHOD AND PROCESSING APPARATUS

CROSS-REFERENCE TO RELATED APPLICATIONS

The present application is a U.S. National Stage Entry of International Patent Application No. PCT/JP2021/015663, filed Apr. 16, 2021, which claims the benefit of priority to Japanese Patent Application No. 2020-081415, filed May 1, 2020, each of which is hereby incorporated herein by reference in its entirety.

TECHNICAL FIELD

The present disclosure relates to a pre-coating method and a processing apparatus.

BACKGROUND

In the related art, there is a technique for forming a carbon film on a substrate (hereinafter also referred to as a wafer), which is an object to be processed, using a plasma CVD (Chemical Vapor Deposition) method.

PRIOR ART DOCUMENT

Patent Document

Patent Document 1: Japanese Laid-Open Patent Publication No. 2005-150622

The present disclosure provides a technique capable of improving the uniformity of film thickness between wafers in continuous film formation.

SUMMARY

According to an aspect embodiment of the present disclosure, a method of pre-coating a carbon film by plasma in a processing container, includes: pre-coating an inner wall of the processing container with a first carbon film by plasma of a first carbon-containing gas under a first pressure; and processing the first carbon film with the plasma under a second pressure.

According to the present disclosure, it is possible to improve the uniformity of film thickness between wafers in continuous film formation.

DETAILED DESCRIPTION

Various embodiments will now be described in detail with reference to the drawings. Note that the disclosed technique is not limited by the following embodiments.

By the way, in a plasma CVD method, in order to improve the stability between wafers when films are continuously formed on a plurality of wafers, it is known to perform pre-coating to coat an inner wall of a processing container (hereinafter also referred to as a "chamber") with a carbon film. However, when a graphene film, which is a carbon film, is formed on the wafer, the carbon film on the inner wall of the chamber is etched by hydrogen introduced to control the film formation characteristics of the graphene film, thereby changing the chamber condition. For this reason, when the graphene film is continuously formed inside the processing container after the pre-coating, a film thickness distribution between the wafers becomes non-uniform due to the change in the chamber condition. Therefore, it is required to improve the uniformity of film thickness between wafers in continuous film formation.

First Embodiment

[Configuration of Processing Apparatus 100]

Figure 1:
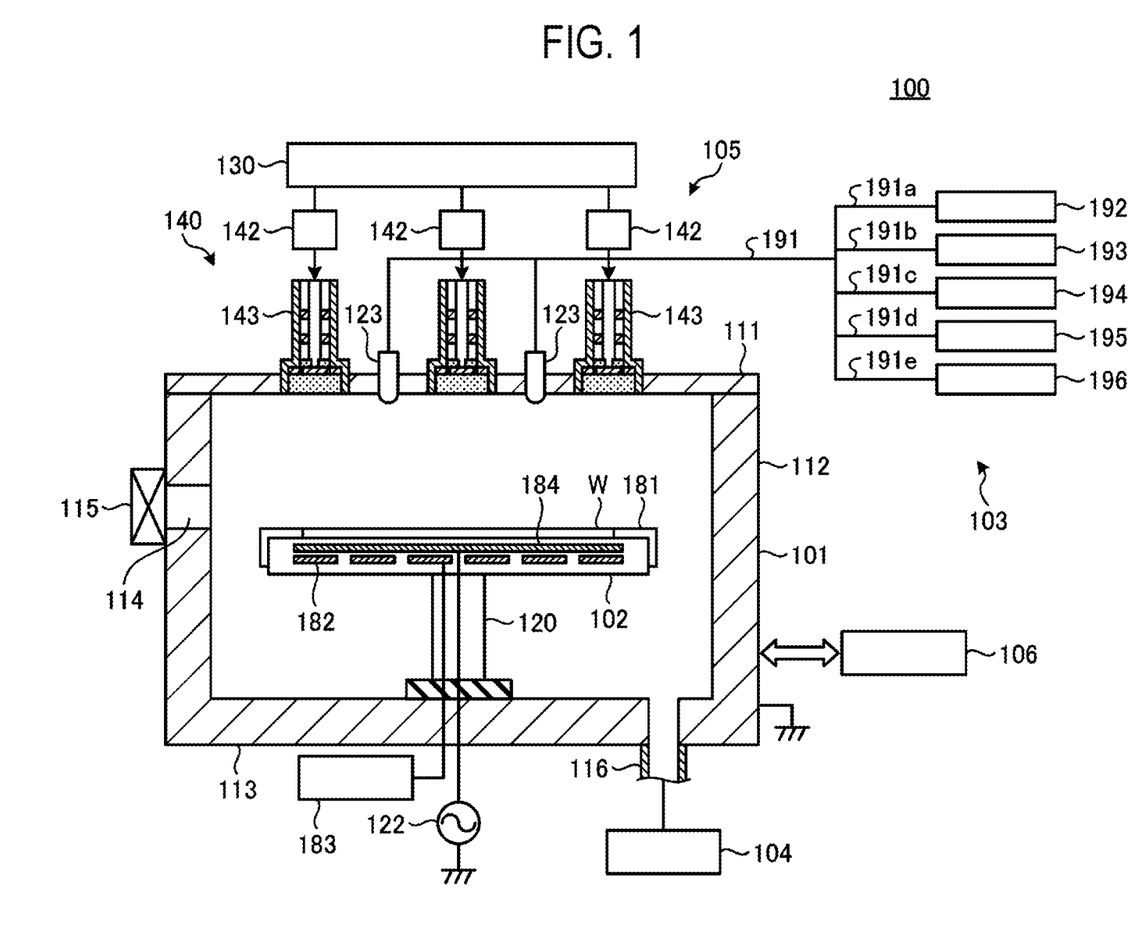
FIG. 1 is a view showing an example of a processing apparatus in a first embodiment of the present disclosure.

FIG. 1 is a view showing an example of a processing apparatus 100 in a first embodiment of the present disclosure. The processing apparatus 100 forms a carbon film on a wafer W by plasma CVD using microwave plasma. The processing apparatus 100 includes a processing container 101, a stage 102, a gas supply mechanism 103, an exhaust device 104, a microwave introduction device 105, and a controller 106. The processing container 101 accommodates the wafer W therein. The stage 102 places the wafer W thereon. The gas supply mechanism 103 supplies a gas into the processing container 101. The exhaust device 104 exhausts the interior of the processing container 101. The microwave introduction device 105 generates a microwave for generating plasma inside the processing container 101 and introduces the microwave into the processing container 101. The controller 106 controls the operation of each part of the processing apparatus 100.

The processing container 101 is formed of a metallic material, such as aluminum or an alloy thereof, has a substantially cylindrical shape, and has a plate-shaped ceiling wall portion 111, a bottom wall portion 113, and a sidewall portion 112 connecting the ceiling wall portion 111 and the bottom wall portion 113. The microwave introduction device 105 is provided above the processing container 101, and functions as a plasma generator that introduces electromagnetic waves (microwaves) into the processing container 101 so as to generate plasma. The microwave introduction device 105 will be described in detail later.

The ceiling wall portion 111 has a plurality of openings into which a microwave radiation mechanism and a gas introduction part (to be described later) of the microwave introduction device 105 are fitted. The sidewall portion 112 has a loading/unloading port 114 for loading/unloading the wafer W therethrough, which is a substrate to be processed, into/from a transfer chamber (not illustrated) provided adjacent to the processing container 101. The loading/unloading port 114 is opened/closed by a gate valve 115. The exhaust device 104 is provided on the bottom wall portion 113. The exhaust device 104 is connected to an exhaust pipe 116 connected to the bottom wall portion 113, and includes a vacuum pump and a pressure control valve. The interior of the processing container 101 is exhausted through the exhaust pipe 116 by the vacuum pump of the exhaust device 104. An internal pressure of the processing container 101 is controlled by the pressure control valve.

The stage 102 has a disc shape and is made of ceramic, such as AlN. The stage 102 is supported by a support member 120 made of ceramic such as AlN and extending upward from the center of the bottom of the processing container 101. A guide ring 181 is provided on the outer edge portion of the stage 102 so as to guide the wafer W. In addition, lifting pins (not illustrated) for raising/lowering the wafer W are provided inside the stage 102 so as to be moved upward and downward with respect to the upper surface of the stage 102. A resistance heater 182 is embedded in the stage 102. The heater 182 heats the wafer W on the stage 102 through the stage 102 based on power provided from a heater power supply 183. A thermocouple (not illustrated) is inserted into the stage 102. The stage 102 is configured to be capable of controlling a heating temperature of the wafer W to a predetermined temperature in a range of, for example, 300 to 1,000 degrees C., based on a signal from the thermocouple. Further, an electrode 184 having a size similar to that of the wafer W is embedded above the heater 182 inside the stage 102. A high-frequency bias power supply 122 is electrically connected to the electrode 184. A high-frequency bias for attracting ions is applied from the high-frequency bias power supply 122 to the stage 102. The high-frequency bias power supply 122 may be omitted depending on the characteristics of plasma processing.

The gas supply mechanism 103 is provided to introduce a plasma-generating gas and a raw material gas for forming a carbon-containing film into the processing container 101, and has a plurality of gas introduction nozzles 123 provided therein. Each gas introduction nozzle 123 is fitted into a respective opening portion formed in the ceiling wall portion 111 of the processing container 101. A gas supply pipe 191 is connected to the gas introduction nozzles 123. The gas supply pipe 191 is branched into five branch pipes 191$a$, 191$b$, 191$c$, 191$d$, and 191$e$. An Ar gas source 192, an $O_2$ gas source 193, a $N_2$ gas source 194, a $H_2$ gas source 195, and a $C_2H_2$ gas source 196 are connected to the branch pipes 191$a$, 191$b$, 191$c$, 191$d$, and 191$e$, respectively. The Ar gas source 192 supplies an Ar gas as a noble gas, which is a plasma-generating gas. The $O_2$ gas source 193 supplies an $O_2$ gas as an oxidation gas, which is a cleaning gas. The $N_2$ gas source 194 supplies a $N_2$ gas used as, for example, a purge gas. The $H_2$ gas source 195 supplies a $H_2$ gas as a reducing gas. The $C_2H_2$ gas source 196 supplies an acetylene ($C_2H_2$) gas as a carbon-containing gas, which is a film-forming raw material gas. The $C_2H_2$ gas source 196 may supply a different carbon-containing gas such as ethylene ($C_2H_4$). The carbon-containing gas supplied by the $C_2H_2$ gas source 196 is an example of a first carbon-containing gas and a second carbon-containing gas, which will be described later. That is, in the first embodiment, the same carbon-containing gas is used as the first carbon-containing gas and the gas contained the second carbon-containing gas. Further, as the first carbon-containing gas and the second carbon-containing gas, different carbon-containing gases such as acetylene and ethylene may be used.

Although not illustrated, each of the branch pipes 191$a$, 191$b$, 191$c$, 191$d$, and 191$e$ is provided with a mass flow controller for controlling a flow rate and valves provided on front and back sides of the mass flow controller. It is also possible to adjust the dissociation of gas by providing a shower plate and supplying the $C_2H_2$ gas and the $H_2$ gas to a position close to the wafer W. The same effect can also be obtained by extending the nozzles for supplying these gases downward.

As described above, the microwave introduction device 105 is provided above the processing container 101, and functions as a plasma generator that introduces electromagnetic waves (microwaves) into the processing container 101 so as to generate plasma.

Figure 2:
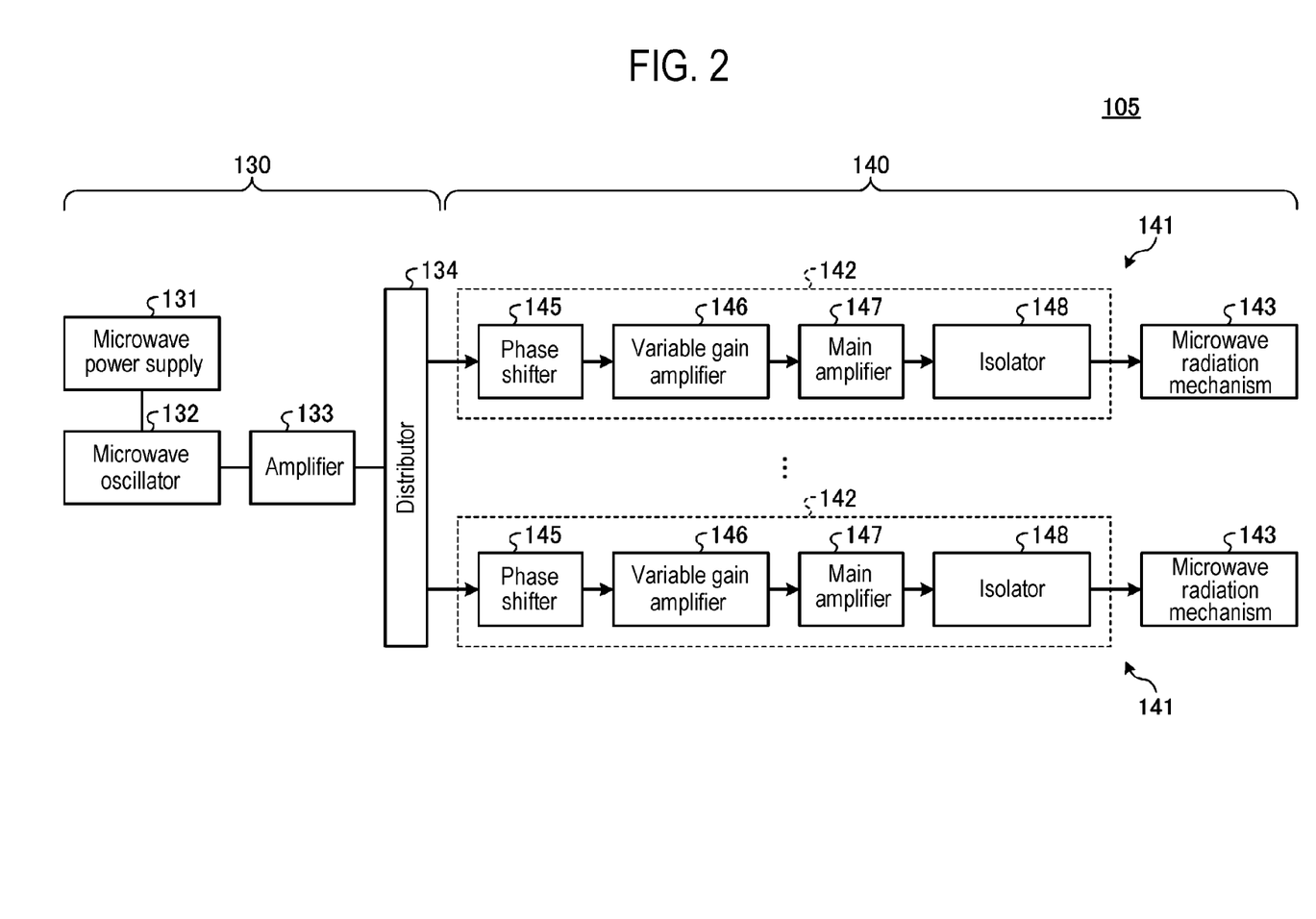
FIG. 2 is a diagram showing an example of a configuration of a microwave introduction device in the first embodiment.

FIG. 2 is a view illustrating an example of a configuration of the microwave introduction device in the first embodiment. As illustrated in FIGS. 1 and 2, the microwave introduction device 105 includes the ceiling wall portion 111 of the processing container 101, a microwave output part 130, and an antenna unit 140. The ceiling wall portion 111 functions as a ceiling plate. The microwave output part 130 generates microwaves, and distributes and outputs the microwaves to a plurality of paths. The antenna unit 140 introduces the microwaves output from the microwave output part 130 into the processing container 101.

The microwave output part 130 has a microwave power supply 131, a microwave oscillator 132, an amplifier 133, and a distributor 134. The microwave oscillator 132 is a solid-state, and oscillates the microwaves, for example, at 860 MHz (e.g., PLL oscillation). The frequency of the microwaves is not limited to 860 MHZ, and may be a frequency in a range of 700 MHz to 10 GHz, such as 2.45 GHz, 8.35 GHz, 5.8 GHz, 1.98 GHz, or the like. The amplifier 133 amplifies the microwaves oscillated by the microwave oscillator 132. The distributor 134 distributes the microwaves amplified by the amplifier 133 to the plurality of paths. The distributor 134 distributes the microwaves while matching impedances on the input side and the output side.

The antenna unit 140 includes a plurality of antenna modules 141. Each of the antenna modules 141 introduces the microwaves distributed by the distributor 134 into the processing container 101. The configurations of all of the antenna modules 141 are the same. Each antenna module 141 has an amplifier part 142 configured mainly to amplify and output the distributed microwaves, and a microwave radiation mechanism 143 configured to radiate, into the processing container 101, the microwaves output from the amplifier part 142.

The amplifier part 142 has a phase shifter 145, a variable gain amplifier 146, a main amplifier 147, and an isolator 148. The phase shifter 145 changes a phase of the microwaves. The variable gain amplifier 146 adjusts a power level of the microwaves input to the main amplifier 147. The main amplifier 147 is configured as a solid-state amplifier. The isolator 148 separates reflected microwaves, which are reflected at an antenna part of the microwave radiation mechanism 143 (to be described later) and are directed toward the main amplifier 147.

Figure 3:
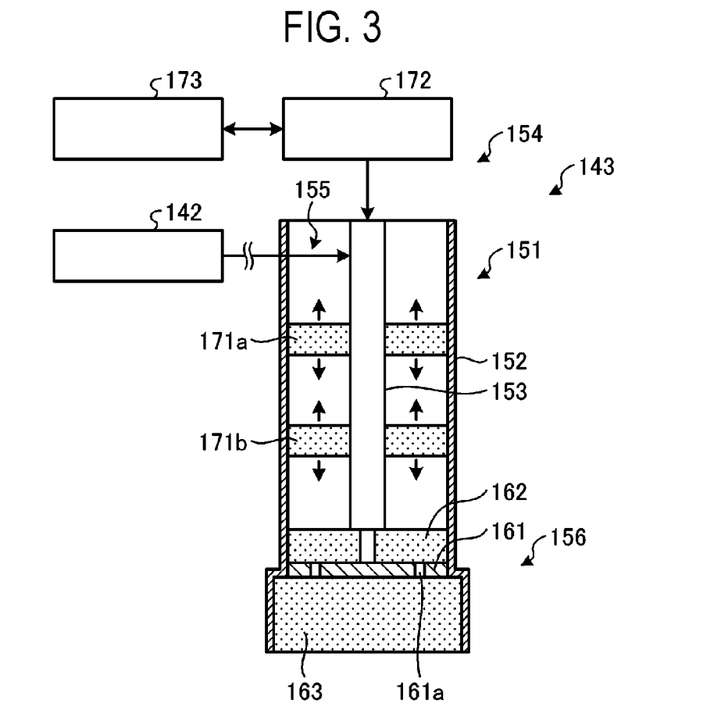
FIG. 3 is a view schematically showing an example of the microwave radiation mechanism in the first embodiment.

Here, the microwave radiation mechanism 143 will be described with reference to FIG. 3. FIG. 3 is a view schematically illustrating an example of the microwave radiation mechanism in the first embodiment. As illustrated in FIG. 1, a plurality of microwave radiation mechanisms 143 are provided on the ceiling wall portion 111. As illustrated in FIG. 3, each microwave radiation mechanism 143 has a cylindrical outer conductor 152 and an inner conductor 153 provided within the outer conductor 152 in a coaxial relationship with the outer conductor 152. The microwave radiation mechanism 143 includes a coaxial tube 151 having a microwave transmission path provided between the outer conductor 152 and the inner conductor 153, a tuner 154, a power-feeding part 155, and an antenna part 156. The tuner 154 matches the impedance of a load with the characteristic impedance of the microwave power supply 131. The power-feeding part 155 feeds the microwaves amplified by the amplifier part 142 to the microwave transmission path. The antenna part 156 radiates the microwaves from the coaxial tube 151 into the processing container 101.

The microwaves amplified by the amplifier part 142 are introduced from the side of the upper end portion of the outer conductor 152 into the power-feeding part 155 through the coaxial cable. The microwaves are radiated by, for example, a power-feeding antenna. By the radiation of the microwaves, the microwave power is fed to the microwave transmission path between the outer conductor 152 and the inner conductor 153. The microwave power propagates toward the antenna part 156.

The antenna part 156 is provided at the lower end portion of the coaxial tube 151. The antenna part 156 includes a disc-shaped planar antenna 161 connected to the lower end portion of the inner conductor 153, a slow-wave material 162 disposed on the upper surface side of the planar antenna 161, and a microwave transmission plate 163 disposed on the bottom surface side of the planar antenna 161. The microwave transmission plate 163 is fitted into the ceiling wall portion 111. The bottom surface of the microwave transmission plate 163 is exposed to the internal space of the processing container 101. The planar antenna 161 has slots 161a formed to penetrate through the planar antenna 161. The shape of each slot 161a is appropriately set such that the microwaves are efficiently radiated. A dielectric material may be inserted into each slot 161a.

The slow-wave material 162 is formed of a material having a dielectric constant higher than a vacuum. The phase of the microwaves may be adjusted based on the thickness of the slow-wave material 162 such that the radiation energy of the microwaves is maximized. The microwave transmission plate 163 is also made of a dielectric material, and has a shape capable of efficiently radiating the microwaves in a TE mode. Then, the microwaves transmitted through the microwave transmission plate 163 generate plasma in the internal space of the processing container 101. As a material for constituting the slow-wave material 162 and the microwave transmission plate 163, for example, quartz, ceramic, or a fluorine-based resin such as a polytetrafluoroethylene resin, a polyimide resin, or the like may be used.

The tuner 154 constitutes a slug tuner. As illustrated in FIG. 3, the tuner 154 has slugs 171a and 171b, an actuator 172, and a tuner controller 173. The slugs 171a and 171b are two slugs arranged on the base end side (upper end side) of the coaxial tube 151 with respect to the antenna part 156. The actuator 172 drives these two slugs independently of each other. The tuner controller 173 controls the actuator 172.

The slugs 171a and 171b have a plate shape and an annular shape, are made of a dielectric material such as ceramic, and are arranged between the outer conductor 152 and the inner conductor 153 of the coaxial tube 151. Further, the actuator 172 individually drives each of the slugs 171a and 171b, for example, by rotating two screws provided inside the inner conductor 153 and screwed to the slugs 171a and 171b, respectively. Then, based on a command from the tuner controller 173, the actuator 172 moves the slugs 171a and 171b in the vertical direction. The tuner controller 173 adjusts the positions of the slugs 171a and 171b such that the impedance at the terminal end portion becomes 50Ω.

The main amplifier 147, the tuner 154, and the planar antenna 161 are arranged close to one another. The tuner 154 and the planar antenna 161 constitute a lumped constant circuit, and also function as a resonator. An impedance mismatch exists in the mounting portion of the planar antenna 161. However, since the tuner 154 directly tunes the plasma load, the plasma load including plasma may be tuned with high precision. Thus, it is possible to eliminate the influence of reflection on the planar antenna 161.

Figure 4:
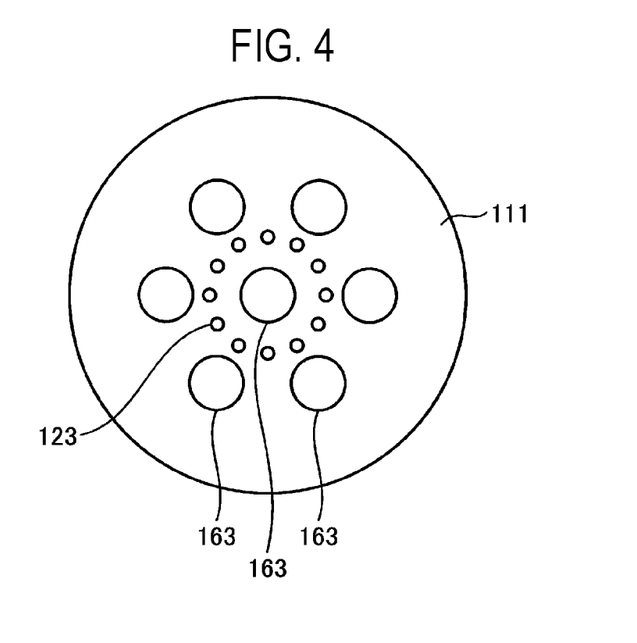
FIG. 4 is a view schematically showing an example of a ceiling wall portion of a processing container in the first embodiment.

For example, seven microwave radiation mechanisms 143 are provided. The microwave transmission plates 163 corresponding to the seven microwave radiation mechanisms 143 are evenly arranged in a hexagonal close-packed arrangement, as shown in FIG. 4. FIG. 4 is a view schematically showing an example of the ceiling wall portion 111 of the processing container 101 according to the first embodiment. That is, one of the seven microwave transmission plates 163 is arranged in the center of the ceiling wall portion 111. The other six microwave transmission plates 163 are arranged around the central microwave transmission plate 163. These seven microwave transmission plates 163 are arranged so that adjacent microwave transmission plates 163 are equidistantly spaced. Further, the plurality of gas introduction nozzles 123 of the gas supply mechanism 103 are arranged so as to surround the central microwave transmission plate 163. Note that the number of microwave radiation mechanisms 143 is not limited to seven.

Returning to FIG. 1, the controller 106 is typically composed of a computer and controls each part of the processing apparatus 100. The controller 106 includes a storage part that stores process recipes, which are process sequences and control parameters of the processing apparatus 100, an input means, a display, and the like, and may perform predetermined control according to a selected process recipe.

For example, the controller 106 controls each part of the processing apparatus 100 so as to perform a pre-coating method to be described later. As a detailed example, the controller 106 performs a pre-coating operation of coating the inner wall of the processing container 101 with a first carbon film by plasma of a first carbon-containing gas under a first pressure. The controller 106 performs a plasma processing operation of processing the first carbon film with plasma under a second pressure. In the plasma processing operation of the present embodiment, the controller 106 forms a second carbon film that coats a wider area of the inner wall of the processing container 101 on the first carbon film than the first carbon film by plasma of a second carbon-containing gas under the second pressure. Here, a mixed gas of the acetylene ($C_2H_2$) gas supplied from the $C_2H_2$ gas source 196 and the $H_2$ gas supplied from the $H_2$ gas source 195 may be used as the first carbon-containing gas and the second carbon-containing gas. The first carbon-containing gas and the second carbon-containing gas may be a mixed gas of a CH-based gas and a H gas, and an ethylene ($C_2H_4$) gas or the like may be used as the CH-based gas. The second pressure is lower than the first pressure. In other words, the first pressure is higher than the second pressure.

[Coating with First Carbon Film]

Figure 5:
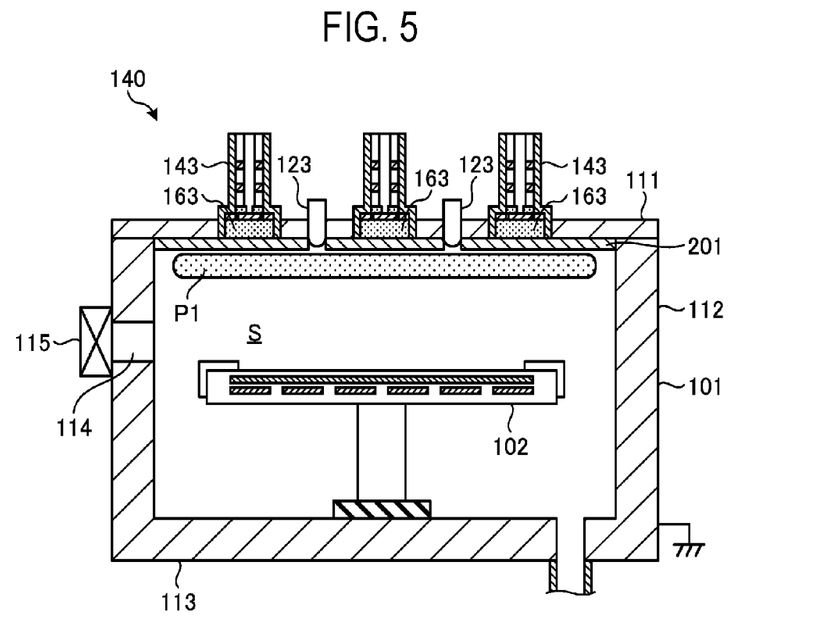
FIG. 5 is a view showing an example of a coating position of a first carbon film in the first embodiment.

FIG. 5 is a view showing an example of the coating position of the first carbon film in the first embodiment. As shown in FIG. 5, the microwave transmission plate 163, which is a plasma source, is provided in the ceiling wall portion 111 of the processing container 101. The lower surface of the microwave transmission plate 163 is exposed to the inner space of the processing container 101. The processing apparatus 100 reduces the pressure of the processing container 101 to the first pressure and supplies the first carbon-containing gas as the plasma generating gas from the gas introduction nozzle 123 into the processing container 101 to ignite plasma. The first pressure is, for example, 2,000 mTorr, which is higher than the second pressure (for example, 50 mTorr) at which the second carbon film 202 (see FIG. 6) is formed on the first carbon film 201. Therefore, as shown in FIG. 5, in the space S of the processing container 101, high-density plasma P1 is formed in the vicinity of the microwave transmission plate 163 which is a plasma source. That is, the plasma P1 is formed in a region immediately below the ceiling wall portion 111. As a result, the inner wall of the ceiling wall portion 111 is coated with the first carbon film 201. Further, the plasma P1 spreads toward the stage 102 as the internal pressure of the processing container 101 decreases, and narrows toward the ceiling wall portion 111 as the internal pressure of the processing container 101 increases. In the following description, a process of coating the inner wall of the processing container 101 (for example, the inner wall of the ceiling wall portion 111) with the first carbon film 201 will be referred to as the pre-coating operation.

In the processing container 101, at the first pressure, the plasma P1 is formed in the region immediately below the ceiling wall portion 111. As a result, the first carbon film 201 is selectively formed on the inner wall of the ceiling wall portion 111. Therefore, the first carbon film 201 may protect the inner wall of the ceiling wall portion 111 where plasma damage is relatively large, thereby suppressing the generation of particles caused by the plasma damage.

[Formation of Second Carbon Film]

Figure 6:
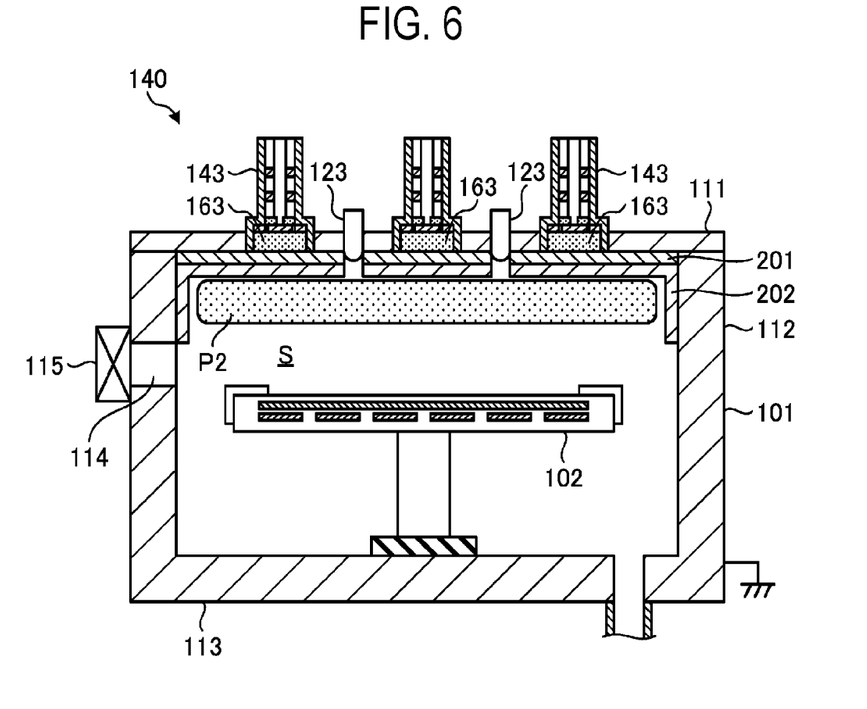
FIG. 6 is a view showing an example of a formation position of a second carbon film in the first embodiment.

FIG. 6 is a view showing an example of a formation position of the second carbon film in the first embodiment. As shown in FIG. 6, the inner wall of the ceiling wall portion 111 is coated with the first carbon film 201 formed by the pre-coating process. The processing apparatus 100 reduces the pressure of the processing container 101 to the second pressure and supplies the second carbon-containing gas as the plasma generating gas from the gas introduction nozzle 123 into the processing container 101 to ignite plasma. The second pressure is, for example, 50 mTorr, which is lower than the first pressure (for example, 2,000 mTorr) at which the inner wall of the processing container 101 is coated with the first carbon film 201. As the internal pressure of the processing container 101 decreases, the ignited plasma spreads toward the stage 102. Therefore, as shown in FIG. 6, in the space S of the processing container 101, plasma P2 is formed in a larger amount than the plasma P1 in the vicinity of the microwave transmission plate 163 which is the plasma source. As a result, the second carbon film 202 is formed on the first carbon film 201. The second carbon film 202 coats a wider area of the inner wall of the processing container 101 than the first carbon film 201. In the following description, a process of processing the first carbon film 201 with plasma to form the second carbon film 202 on the first carbon film 201 will be referred to as a plasma processing operation.

In the processing container 101, at the second pressure, the plasma P2 is formed in a region immediately below the ceiling wall portion 111 and in the vicinity of the upper portion of the sidewall portion 112. As a result, the second carbon film 202 is formed on the first carbon film 201 and on the upper inner wall of the sidewall portion 112. Therefore, the inner wall of the ceiling wall portion 111 may be protected by the first carbon film 201 and the second carbon film 202, and the upper inner wall of the sidewall portion 112 may be protected by the second carbon film 202. As a result, a change in the chamber condition may be suppressed. As a result, even when continuous film formation is performed on the wafer W in the processing container 101 after the pre-coating operation, uneven film thickness distribution between wafers W due to the change in the chamber condition may be suppressed. That is, it is possible to improve the uniformity of the film thickness between wafers W in continuous film formation.

Further, in the pre-coating operation and the plasma processing operation, when a hydrogen ($H_2$) gas is added to the first carbon-containing gas and the second carbon-containing gas, the $H_2$ gas contributes as an etching component when forming the first carbon film 201 and the second carbon film 202. Therefore, the $H_2$ gas may etch an unstable carbon bond to stabilize the structures of the first carbon film 201 and the second carbon film 202. A flow rate ratio of a $H_2$ gas to a $C_2H_2$ gas in the second carbon-containing gas is preferably higher than a flow rate ratio of a $H_2$ gas to a $C_2H_2$ gas in the first carbon-containing gas. That is, a first flow rate ratio is used as the flow rate ratio of the $H_2$ gas to the $C_2H_2$ gas in the pre-coating operation, and a second flow rate ratio higher than the first flow rate ratio is used as the flow rate ratio of the $H_2$ gas to the $C_2H_2$ gas in the plasma processing operation. As a result, the structure of the second carbon film 202, which is the outermost layer, may be further stabilized. As a result, when a graphene film, which is a carbon film, is formed on the wafer W, it is possible to suppress etching of the second carbon film 202 by the $H_2$ gas introduced for controlling the film formation characteristics, which stabilizes the chamber condition.

Further, in the pre-coating operation, when a nitrogen ($N_2$) gas is added to the first carbon-containing gas, nitrogen is added into the first carbon film 201, so that the etching resistance of the first carbon film 201 may be improved. Therefore, the first carbon-containing gas preferably further contains the $N_2$ gas. On the other hand, in the plasma processing operation, when a nitrogen ($N_2$) gas is added to the second carbon-containing gas, nitrogen is added to the second carbon film 202, like the first carbon film 201. However, since the second carbon film 202 is the outermost layer, nitrogen from the second carbon film 202 may adversely affect the wafer W when film formation is performed on the wafer W. Therefore, the second carbon-containing gas preferably does not contain an $N_2$ gas.

[Film-Forming Process]

Figure 7:
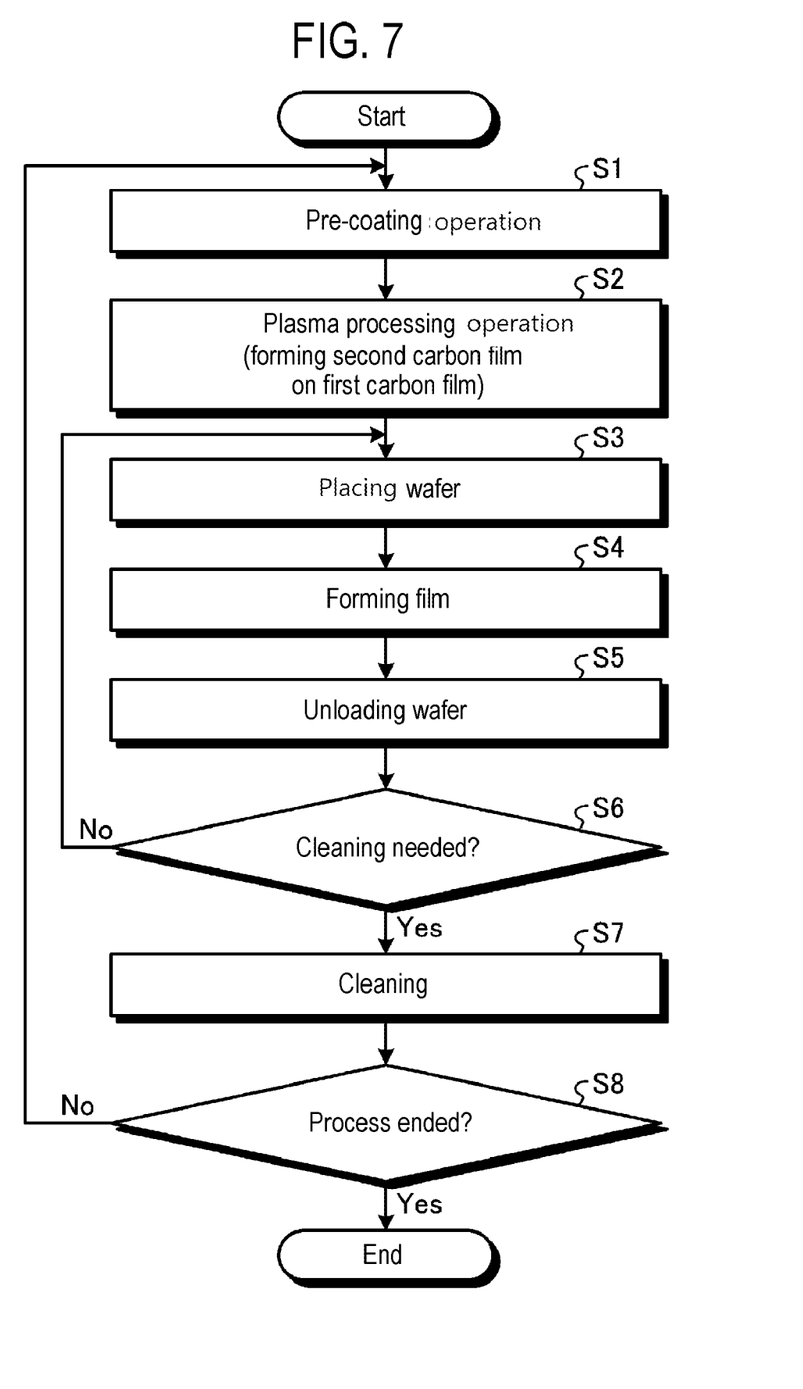
FIG. 7 is a flowchart showing an example of a flow of a film-forming process to which a pre-coating method according to the first embodiment is applied.

Next, description will be given of a flow of a film-forming process to which the pre-coating method according to the first embodiment is applied. FIG. 7 is a flowchart showing an example of the flow of film-forming process to which the pre-coating method according to the first embodiment is applied.

As shown in FIG. 7, the controller 106 executes the pre-coating operation (step S1). The controller 106 executes the pre-coating operation in a state where the wafer W is not loaded into the processing container 101. The controller 106 reduces the internal pressure of the processing container 101 to a first pressure (for example, 2,000 mTorr). The controller 106 supplies an Ar gas, which is a plasma generating gas, into the processing container 101 from the gas introduction nozzle 123. Then, the controller 106 radiates a microwave from the microwave radiation mechanism 143 to generate plasma in the processing container 101. The controller 106 supplies a first carbon-containing gas from the gas introduction nozzle 123 at the timing when the plasma is generated.

As a result, the inner wall of the ceiling wall portion 111 is coated with a first carbon film 201. By performing the pre-coating operation, a particle source present in the processing container 101 is covered with the first carbon film 201.

Further, in the pre-coating operation, when a $H_2$ gas is added to the first carbon-containing gas, the $H_2$ gas contributes to the first carbon film 201, as an etching component. In this way, by adding the etching component, an unstable carbon bond may be etched to stabilize the structure of the first carbon film 201. In the pre-coating operation, a first flow rate ratio is used as the flow rate ratio of the $H_2$ gas to the $C_2H_2$ gas. Further, in the pre-coating operation, when an $N_2$ gas is added to the first carbon-containing gas, nitrogen is added to the first carbon film 201, so that the etching resistance of the first carbon film 201 may be improved.

For example, the controller 106 controls each part of the processing apparatus 100 so that the pre-coating operation is performed under the following process conditions.
(Process Conditions for Pre-Coating Operation)
Microwave power of microwave radiation mechanism 143 arranged in the center: 0 to 550 W
Microwave power of microwave radiation mechanism 143 arranged around: 0 to 550 W
Internal pressure of processing container 101: 20 to 10,000 mTorr (2.7 to 1,330 Pa)
Process gas: $C_2H_2$=0.1 to 100 sccm
$H_2$=0 to 500 sccm
Ar=0 to 3,000 sccm
$N_2$=0 to 3,000 sccm
Processing time: 1 to 3,600 sec The controller 106 executes the plasma processing operation (step S2). The controller 106 reduces the internal pressure of the processing container 101 to a second pressure (for example, 50 mTorr). The controller 106 supplies an Ar gas, which is a plasma generating gas, into the processing container 101 from the gas introduction nozzle 123. Then, the controller 106 radiates a microwave from the microwave radiation mechanism 143 to generate plasma in the processing container 101. The controller 106 supplies a second carbon-containing gas from the gas introduction nozzle 123 at the timing when the plasma is generated. As a result, a second carbon film 202 is formed on the first carbon film 201. The second carbon film 202 coats a wider area of the inner wall of the processing container 101 than the first carbon film 201. As a result, the first carbon film 201 and the upper inner wall of the sidewall portion 112 are coated with the second carbon film 202. As a result, a change in the chamber condition may be suppressed.

Further, in the plasma processing operation, when a $H_2$ gas is added to the second carbon-containing gas, the $H_2$ gas contributes to the second carbon film 202, as an etching component. In this way, by adding the etching component, an unstable carbon bond may be etched to stabilize the structure of the second carbon film 202. In the plasma processing operation, a second flow rate ratio is used as the flow rate ratio of the $H_2$ gas to the $C_2H_2$ gas. The second flow rate ratio is higher than the first flow rate ratio. That is, in the plasma processing operation, the second flow rate ratio higher than the first flow rate ratio is used as the flow rate ratio of the $H_2$ gas to the $C_2H_2$ gas. As a result, the structure of the second carbon film 202, which is the outermost layer, may be further stabilized. As a result, it is possible to suppress etching of the second carbon film 202 by the $H_2$ gas introduced for controlling film formation characteristics in a film-forming process to be described later, so that the chamber condition may be stabilized. In the plasma processing operation, it is preferable that the second carbon-containing gas does not contain an $N_2$ gas in order to prevent addition of nitrogen to the second carbon film 202 of the outermost layer.

For example, the controller 106 controls each part of the processing apparatus 100 so that the plasma processing operation is performed under the following process conditions.
(Process Conditions for Plasma Processing Operation)
Microwave power of microwave radiation mechanism 143 arranged in the center: 0 to 550 W
Microwave power of microwave radiation mechanism 143 arranged around: 0 to 550 W
Internal pressure of processing container 101: 10 to 1,000 mTorr (1.3 to 130 Pa)
Process gas: $C_2H_2$=0.1 to 100 sccm
$H_2$=1 to 500 sccm
Ar=0 to 3,000 sccm
$N_2$=0 to 3,000 sccm
Processing time: 1 to 3,600 sec The controller 106 mounts the wafer W on the stage 102 inside the processing container 101 (step S3).

The controller 106 executes the film-forming process (step S4). The controller 106 sets the internal pressure of the processing container 101 to, for example, 50 mTorr, and supplies an Ar gas, which is a plasma generating gas, into the processing container 101 from the gas introduction nozzle 123. Then, the controller 106 radiates a microwave from the microwave radiation mechanism 143 to generate plasma in the processing container 101. The controller 106 supplies a carbon-containing gas such as a $C_2H_2/H_2$ gas from the gas introduction nozzle 123 at the timing when the plasma is generated. As a result, a graphene film, which is a carbon film, is formed on the wafer W. The $H_2$ gas contained in the carbon-containing gas contributes as an etching component and is introduced for controlling the film formation characteristics of the graphene film.

For example, the controller 106 controls each part of the processing apparatus 100 so that the film-forming process is performed under the following process conditions.
(Process Conditions for Film-Forming Process)
Microwave power of microwave radiation mechanism 143 arranged in the center: 0 to 550 W
Microwave power of microwave radiation mechanism 143 arranged around: 0 to 550 W
Internal pressure of processing container 101: 10 to 1,000 mTorr (13.3 to 130 Pa)
Process gas: $C_2H_2$=0.1 to 100 sccm
$H_2$=0 to 500 sccm
Ar=1 to 3,000 sccm
Processing time: 1 to 3,600 sec The controller 106 unloads the wafer W on which the graphene film is formed, from the processing container 101 (step S5). The controller 106 determines whether or not the interior of the processing container 101 needs to be cleaned (step S6). For example, the controller 106 determines whether or not the number of wafers W processed in the processing container 101 after cleaning has reached a predetermined value. When the controller 106 determines that the interior of the processing container 101 does not need to be cleaned (step S6: "No"), the controller 106 returns to step S3 where the next wafer W is placed and the film-forming process is performed.

When the controller 106 determines that the interior of the processing container 101 needs to be cleaned (step S6: "Yes"), it executes a cleaning process of cleaning the interior of the processing container 101 (step S7). In the cleaning process, the controller 106 supplies a cleaning gas into the processing container 101 to clean the interior of the processing container 101.

The controller 106 determines whether or not to end the film-forming process (step S8). When the controller 106 determines not to end the film-forming process (step S8: "No"), the controller 106 returns to step S1 where the pre-coating operation and the plasma processing operation are executed. On the other hand, when the controller 106 determines to end the film-forming process (step S8: "Yes"), it ends the film-forming process.

Second Embodiment

In the first embodiment, the second carbon film 202 is formed on the first carbon film 201 by plasma in the plasma processing operation, but the surface of the first carbon film 201 may be modified by plasma.

[Modification of First Carbon Film]

Figure 8:
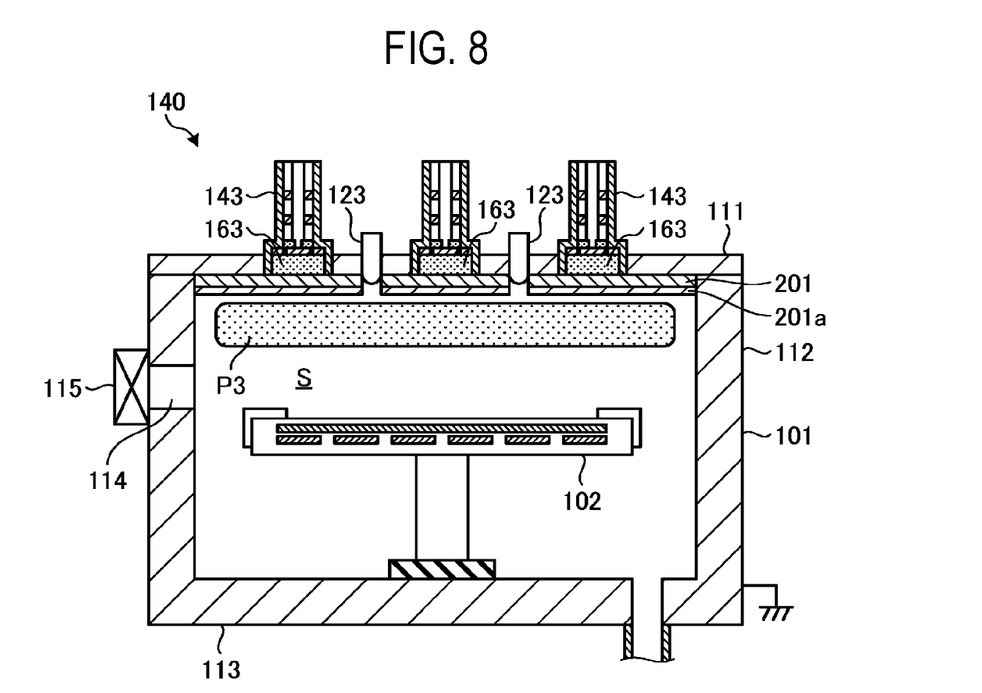
FIG. 8 is a view for explaining an example of modification of the first carbon film in a second embodiment.

FIG. 8 is a view showing an example of a modification of the first carbon film 201 in a second embodiment. As shown in FIG. 8, the inner wall of the ceiling wall portion 111 is coated with the first carbon film 201 formed by the pre-coating operation. The processing apparatus 100 reduces the pressure of the processing container 101 to the second pressure and supplies a modifying gas as a plasma generating gas from the gas introduction nozzle 123 into the processing container 101 to ignite plasma. The modifying gas is, for example, a mixed gas of a $H_2$ gas and a noble gas. The noble gas is, for example, an Ar gas. The second pressure is, for example, 50 mTorr, which is lower than the first pressure (for example, 2,000 m Torr) when the inner wall of the processing container 101 is coated with the first carbon film 201. As the internal pressure of the processing container 101 decreases, the ignited plasma spreads toward the stage 102. Therefore, as shown in FIG. 8, in the space S of the processing container 101, plasma P3 is formed in a larger amount than the plasma P1 (see FIG. 5) in the vicinity of the microwave transmission plate 163 which is the plasma source. Further, in the space S of the processing container 101, as the plasma P3 spreads toward the stage 102, the molecules, atoms, active species, or the like of the modifying gas (the $H_2$ gas) are activated. Therefore, as shown in FIG. 8, by exposing the first carbon film 201 to the molecules, atoms, active species, or the like of the activated modifying gas (the $H_2$ gas), the surface of the first carbon film 201 is modified to form a modified film 201a. The modified film 201a is cured by being exposed to the molecules, atoms, active species, or the like of the modified gas (the $H_2$ gas), to become a film having higher plasma resistance to hydrogen than the first carbon film 201. As a result, a change in the chamber condition may be suppressed. As a result, even when continuous film formation is performed on the wafer W in the processing container 101 after the pre-coating operation, uneven film thickness distribution between wafers W due to the change in the chamber condition may be suppressed. That is, it is possible to improve the uniformity of the film thickness between wafers W in continuous film formation.

[Film-Forming Process]

Figure 9:
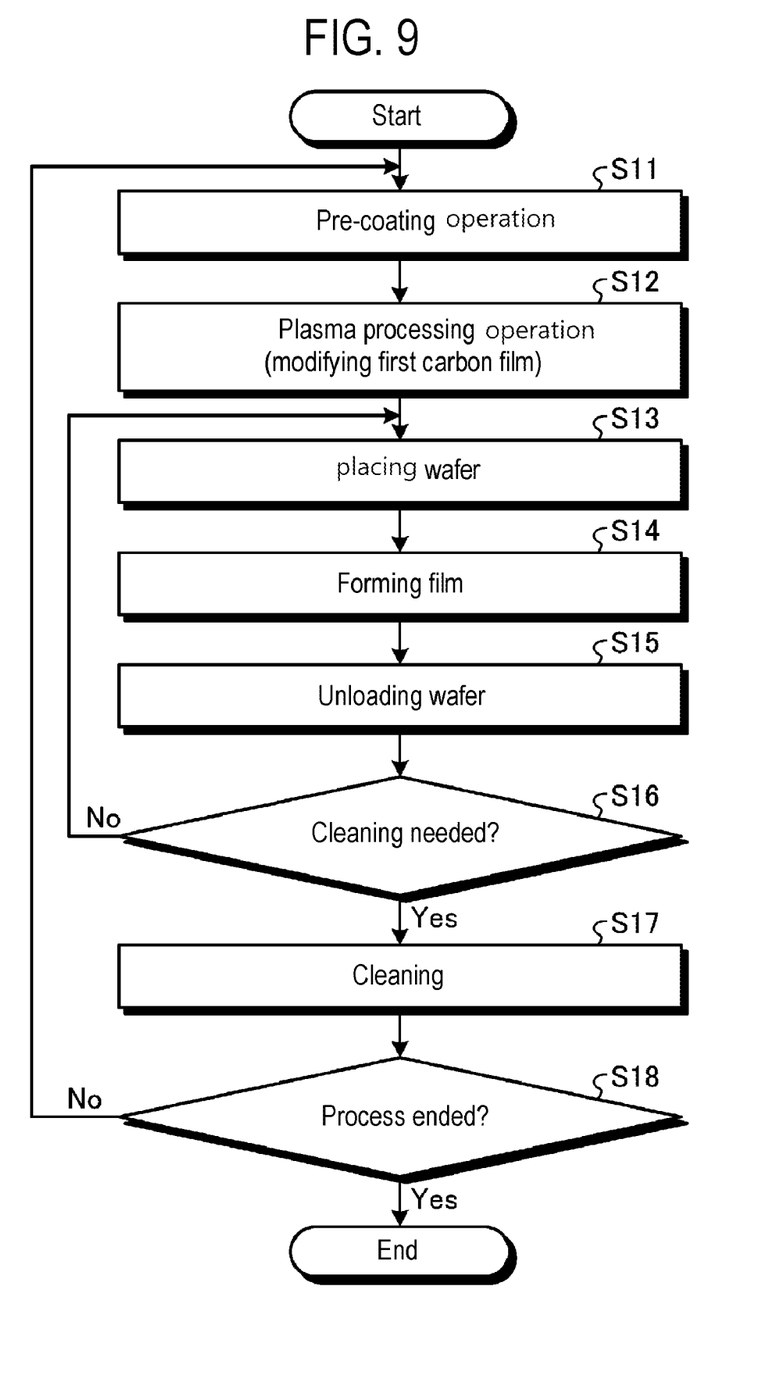
FIG. 9 is a flowchart showing an example of a flow of a film-forming process to which a pre-coating method according to the second embodiment is applied.

Next, description will be given of a flow of a film-forming process to which the pre-coating method according to the second embodiment is applied. FIG. 9 is a flowchart showing an example of the flow of the film-forming process to which the pre-coating method according to the second embodiment is applied. Steps S13 to S18 in FIG. 9 are the same as steps S3 to S8 in FIG. 7, respectively, and therefore, detailed explanation thereof is omitted.

As shown in FIG. 9, the controller 109 executes the pre-coating operation (step S11). As in the first embodiment, the controller 106 performs the pre-coating operation in a state where the wafer W is not loaded into the processing container 101. The controller 106 reduces the internal pressure of the processing container 101 to a first pressure (for example, 2,000 mTorr), ignites plasma, and supplies a first carbon-containing gas. As a result, the inner wall of the ceiling wall portion 111 is coated with a first carbon film 201. By performing the pre-coating operation, a particle source present in the processing container 101 is covered with the first carbon film 201.

The controller 109 executes the plasma processing operation (step S12). The controller 106 reduces the internal pressure of the processing container 101 to a second pressure (for example, 50 mTorr), ignites plasma, and supplies a modifying gas. As a result, the surface of the first carbon film 201 is modified.

(Process Conditions for Plasma Processing Operation (Modifying Operation))

Microwave power of microwave radiation mechanism 143 arranged in the center: 0 to 550 W Microwave power of microwave radiation mechanism 143 arranged around: 0 to 550 W Internal pressure of processing container 101: 10 to 1,000 mTorr (1.3 to 130 Pa)

Process gas: $H_2$=1 to 500 sccm

Ar=0 to 3,000 sccm $N_2$=0 to 3,000 sccm where, $H_2$/Ar=0.1% to 100%

Processing time: 1 to 3,600 sec

Experimental Result

Figure 10:
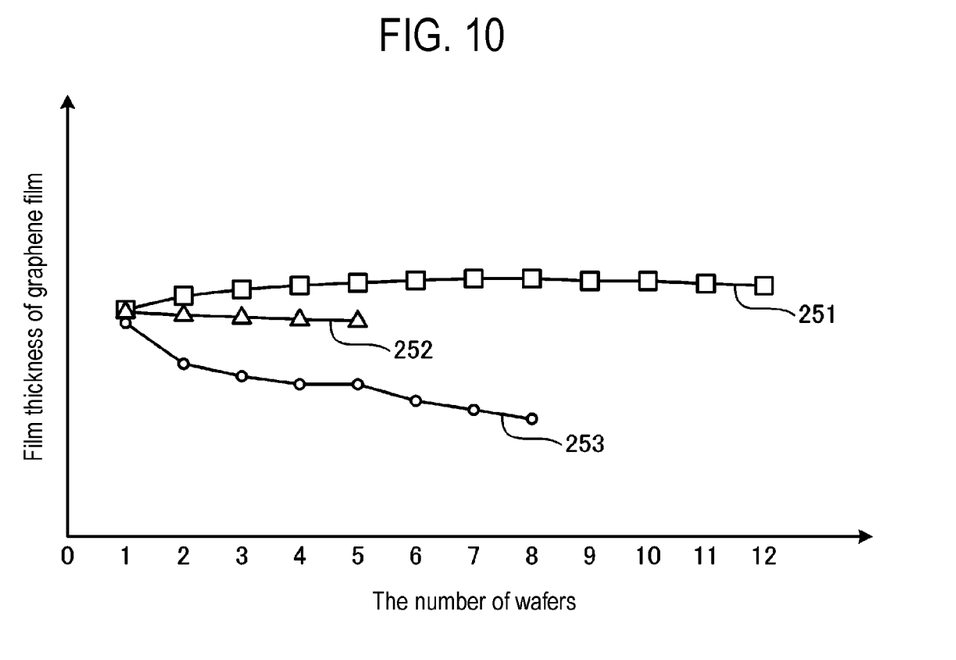
FIG. 10 is a graph showing an example of a change in thickness of a graphene film formed on a wafer W when the pre-coating method according to each embodiment is applied and when a general pre-coating method is applied.

Experiments were conducted on the change in the film thickness of the graphene film when the graphene film was continuously formed on the wafer W by applying the pre-coating method according to each of the above-described embodiments. FIG. 10 is a graph showing an example of the change in the film thickness of the graphene film formed on the wafer W when the pre-coating method according to each embodiment is applied and when a general pre-coating method is applied. Graphs 251 to 253 are shown in FIG. 10. The graph 251 is a graph when the pre-coating method according to the first embodiment (that is, the pre-coating method of forming the second carbon film 202 on the first carbon film 201) is applied to perform a graphene film-forming process on 12 sheets of wafers W. The graph 252 is a graph when the pre-coating method according to the second embodiment (that is, the pre-coating method of modifying the surface of the first carbon film 201) is applied to perform a graphene film-forming process on five sheets of wafers W. The graph 253 is a graph when the general pre-coating method is applied to perform a graphene film-forming process on eight sheets of wafers W. Here, the general pre-coating method is a pre-coating method in which a plasma processing operation is not performed after a pre-coating operation is performed.

As shown in the graph 253, when the general pre-coating method was applied, the film thickness of the graphene film of the second and subsequent wafers W changed in the way of being thinner than that of the first wafer W. On the other hand, as shown in the graphs 251 and 252, when the pre-coating method according to each embodiment was applied, there was almost no change in the film thickness of the graphene film, and the film thickness of the second and subsequent wafers W was substantially constant. That is, in each embodiment, it was confirmed that the uniformity of the film thickness between the wafers W in the continuous film formation of the graphene film could be improved.

As described above, according to the first embodiment, the processing apparatus 100 includes the processing container 101 in which a carbon film (graphene film) is formed by plasma, and the controller 106. The controller 106 performs the pre-coating operation of coating the inner wall of the processing container 101 with the first carbon film 201 by plasma of the first carbon-containing gas under the first pressure, and the plasma processing operation of processing the first carbon film 201 by plasma under the second pressure. As a result, it is possible to improve the uniformity of film thickness between the wafers W in continuous film formation.

Further, according to the first embodiment, the second pressure is lower than the first pressure. In other words, the first pressure is higher than the second pressure. By setting the first pressure to a high pressure, the plasma generated in the processing container may be selectively spread within a range suitable for processing the first carbon film 201.

Further, according to the first embodiment, the plasma processing operation forms the second carbon film, which coats a wider area of the inner wall of the processing container than the first carbon film, on the first carbon film by plasma of the second carbon-containing gas under the second pressure. As a result, it is possible to suppress the change in the chamber condition, so that it is possible to suppress the film thickness distribution between the wafers W from becoming non-uniform due to the change in the chamber condition.

Further, according to the first embodiment, the first carbon-containing gas and the second carbon-containing gas are gases including the CH-based gas and the $H_2$ gas. In the pre-coating operation, the first flow rate ratio is used as the flow rate ratio of the $H_2$ gas to the CH-based gas, and in the plasma processing operation, the second flow rate ratio, which is higher than the first flow rate ratio, is used as the flow rate ratio of the $H_2$ gas to the CH-based gas. As a result, when a graphene film, which is a carbon film, is formed on the wafer W, it is possible to suppress etching of the second carbon film 202 by the $H_2$ gas introduced for controlling the film formation characteristics, so that the chamber condition may be more stabilized.

Further, according to the first embodiment, the first carbon-containing gas further includes an $N_2$ gas, and the second carbon-containing gas does not contain an $N_2$ gas. As a result, the etching resistance of the first carbon film 201 may be improved, and the possibility that nitrogen from the second carbon film 202 adversely affects the wafer W may be reduced.

Further, according to the second embodiment, the plasma processing operation modifies the surface of the first carbon film with plasma of the modifying gas under the second pressure. As a result, it is possible to suppress a change in the chamber condition, so that it is possible to suppress the film thickness distribution between the wafers W from becoming non-uniform due to the change in the chamber condition.

Further, according to the second embodiment, the modifying gas is a gas including the $H_2$ gas and the noble gas. As a result, the surface of the first carbon film 201 may be modified to form the modified film 201a having higher plasma resistance to hydrogen than the first carbon film 201.

Further, according to the second embodiment, the noble gas is an Ar gas. As a result, plasma may be easily ignited.

It is noted that the embodiments disclosed this time should be considered as examples and not restrictive in all respects. The above-described embodiments may be omitted, substituted, or changed in various ways without departing from the appended claims and the gist thereof.

For example, in the above-described embodiments, the pre-coating operation and the plasma processing operation are performed without mounting the wafer W on the stage 102, but the disclosed technique is not limited thereto. For example, in order to prevent particles from falling onto the stage 102 and prevent a carbon film from depositing on the surface of the stage 102, a dummy wafer may be placed to perform the pre-coating operation and the plasma processing operation.

Further, in the above-described embodiments, an aspect in which the graphene film is formed on the wafer W has been described, but the present disclosure is not limited thereto. For example, the present disclosure may be applied to a case of forming an amorphous carbon film or a diamond-like carbon film on the wafer W.

Further, in the above-described embodiments, the processing apparatus 100 in which the plurality of microwave radiation mechanisms 143, which are microwave sources, are provided in the processing container 101 is used, but the present disclosure is not limited thereto. For example, a processing apparatus that radiates a microwave by using a single planar slot antenna as a microwave source may be used.

Further, in the above-described embodiments, the ceiling wall portion 111 is provided with the plurality of gas introduction nozzles 123, but the present disclosure is not limited thereto. For example, a gas may be supplied through a shower plate provided above the stage inside the processing container so as to partition the top and bottom.

EXPLANATION OF REFERENCE NUMERALS

100: processing apparatus, 101: processing container, 102: stage, 106: controller, 111: ceiling wall portion, 112: sidewall portion, 201: first carbon film, 202: second carbon film, P1 to P3: plasma, W: wafer

What is claimed is:
1. A method of pre-coating a carbon film by plasma in a processing container, which includes a ceiling wall, a bottom wall, and a sidewall connecting the ceiling wall and the bottom wall, the method comprising:
    forming a first carbon film selectively on an inner surface of the ceiling wall by plasma of a first carbon-containing gas under a first pressure; and
    forming a second carbon film on the first carbon film and on an upper inner surface of the sidewall by plasma of a second carbon-containing gas under a second pressure,
    wherein the second pressure is lower than the first pressure,
    wherein the first carbon-containing gas and the second carbon-containing gas are gases including a CH-based gas and $H_2$ gas,
    wherein the forming the first carbon film uses a first flow rate ratio as a flow rate ratio of the $H_2$ gas to the CH-based gas, and
    wherein the forming the second carbon film uses a second flow rate ratio, which is higher than the first flow rate ratio, as the flow rate ratio of the $H_2$ gas to the CH-based gas.

2. The method of claim 1, wherein the first carbon-containing gas further contains $N_2$ gas, and
   wherein the second carbon-containing gas does not contain $N_2$ gas.

3. A method of pre-coating a carbon film by plasma in a processing container, which includes a ceiling wall, a bottom wall, and a sidewall connecting the ceiling wall and the bottom wall, the method comprising:
   forming a first carbon film selectively on an inner surface of the ceiling wall by plasma of a carbon-containing gas under a first pressure; and
   modifying a surface of the first carbon film by plasma of a modifying gas under a second pressure,
   wherein the second pressure is lower than the first pressure, and
   wherein the modifying gas includes $H_2$ gas.

4. The method of claim 3, wherein the modifying gas is a gas including $H_2$ gas and a noble gas.

5. The method of claim 4, wherein the noble gas is Ar gas.

* * * * *